United States Patent [19]

Hayes

[11] 4,323,825
[45] Apr. 6, 1982

[54] DEFLECTION SYSTEM WITH POSITIVE FEEDBACK

[75] Inventor: Robert S. Hayes, Pasadena, Calif.

[73] Assignee: Mohawk Data Sciences Corp., Parsippany, N.J.

[21] Appl. No.: 193,989

[22] Filed: Oct. 6, 1980

[51] Int. Cl.³ .................. H01J 29/70; H01J 29/72
[52] U.S. Cl. ..................................................... 315/387
[58] Field of Search ............... 315/405, 399, 408, 387, 315/409, 410

[56] References Cited

U.S. PATENT DOCUMENTS

| | | | |
|---|---|---|---|
| 2,747,136 | 5/1956 | Werzog | 315/27 |
| 3,404,310 | 10/1968 | Williams | 315/27 |
| 3,487,260 | 12/1969 | Eberhard | 315/27 |
| 3,764,846 | 10/1973 | Gantt et al. | 315/27 |
| 3,767,964 | 10/1973 | Varian | 315/27 |
| 4,028,598 | 6/1977 | Verbeij | 315/408 |
| 4,115,725 | 9/1978 | Washimoto | 315/403 |

OTHER PUBLICATIONS

Chapter 17–"Technical Television", A.U.J. Martin–-Prentice Hall, 1962.

Primary Examiner—Theodore M. Blum
Attorney, Agent, or Firm—Robert R. Hubbard

[57] ABSTRACT

An electron beam deflection circuit useful in cathode ray tube displays which employ television scanning principles. The deflection circuit is characterized by transformer coupling between a source of horizontal drive signal and a switching transistor for the horizontal deflection coil. Energy stored in the transformer during the scan and retrace time is utilized during the scanning time to provide base current to the switching transistor. In addition, the transformer has a second primary winding connected in the emitter circuit of the switching transistor in a manner to allow positive feedback. The positive feedback enhances and sustains the base current during scanning time and controls its magnitude. The circuit is advantageous in that it eliminates the need for precise waveshaping circuits at the input to the switching transistor and lowers the power requirements for the circuits which precede the switching transistor.

2 Claims, 2 Drawing Figures

DEFLECTION SYSTEM WITH POSITIVE FEEDBACK

FIELD OF INVENTION

This invention relates generally to systems for deflecting an electron beam, and more particularly to a novel and improved driving circuit for a magnetic deflection coil which is associated with a cathode ray tube (CRT).

More directly the circuit of this invention is useful in apparatus, such as television systems, which use of horizontal line scanning technique. According to this technique, horizontal and vertical deflection coils are arranged and driven with periodic signals to deflect the CRT beam so as to produce at the CRT screen a scanning raster consisting of a series of horizontal scanning lines in much the same manner as a printed page is read. That is, starting at the top left corner of the CRT screen, the beam scans horizontally across to the right hand side and is then quickly returned to the left hand side a little below the initial starting point, from whence the beam again scans horizontally to the right hand side, and so on. Each round trip of the CRT beam from the left hand side of the screen to the right hand side and back again consists of a scanning interval followed by a retrace interval and corresponds to one cycle or period of the periodic signal occuring in the horizontal deflection coil. In order to produce substantially linear horizontal scans, the beam is deflected in a substantially linear manner. In electromagnetic deflection systems, this is achieved by requiring the deflection coil current to be linear during the scanning intervals.

PRIOR ART

Prior art horizontal deflection coil circuits have been characterized by a driver electron discharge device, such as a vacuum tube or a transistor, to assist in providing a linear deflection coil current during scan intervals. Such circuits have also been characterized by the coil being coupled in a tank network so as to use the energy stored in the coil during the scan intervals to return the beam during the retrace intervals. Circuits of this type are disclosed in U.S. Pat. Nos. 3,764,846 and 4,115,725 and in chapter 17 of a book entitled Technical Television, A. V. J. Martin, Prentice Hall, 1962.

According to the operation of these circuits, upon interruption of the linear coil current at the end of the scan interval, the stored energy produces a flyback signal of a considerable magnitude. Particularly, the first half cycle of a sinusoidal oscillation is used to reverse the direction of current flow and thus retrace the beam. A damping diode is arranged to terminate this sinusoidal oscillation, and to allow the coil current to decay linearly until approximately the midpoint of the next scan interval, at which point the diode cuts off and the electron discharge device becomes operative to allow deflection current to increase linearly until the end of the scan interval. In such circuits it has been necessary to use wave shaping circuits to precisely control the on and off time of the electronic discharge device in order to assure proper deflection action.

SUMMARY OF THE INVENTION

This invention is embodied in an electron beam deflection circuit which is responsive to a source of periodic drive signals to provide a periodic sawtooth current in a deflection coil. Each period of the sawtooth current has a retrace interval and a scanning interval. The sawtooth current has a substantially linear ramp during the scanning interval so as to store energy in the deflection coil. The deflection circuit includes a switching transistor having its base coupled to respond to both the periodic drive signal and the current flowing in the transistor emitter circuit. The deflection coil, a retrace capacitor and a damping diode form a tank circuit for retrace. The circuit operation is such that during the retrace intervals the transistor is cut off and the damping diode becomes forward biased after the stored energy completes about one-half cycle of an oscillation in the tank network. The diode continues to be forward biased to damp such oscillation and to complete a current path for the sawtooth current until approximately the midpoint of the ensuing scanning interval. At this time the forward bias of the diode is removed and the collector to emitter path of the switching transistor thereafter completes the current path for the sawtooth current for the remainder of the scanning interval.

In accordance with this invention the deflection circuit is characterized by a transformer having two primary windings coupled to receive the periodic drive signal and the emitter current signal, and a secondary winding coupled to the base of the switching transistor. During each scanning interval the transformer acts as a current transformer, and couples current from the emitter circuit to the base circuit of the switching transistor. The transformer coupling between the driver transistor base and emitter leads provides a positive feedback so as to enhance and sustain the base current to the switching transistor throughout the second half of the scanning interval. This coupling also sets the ratio of base and emitter current by selection of the transformer turns ratio.

This arrangement provides at least three benefits. First it assures a continuous supply of base current to the switching transistor in proportion to its collector and emitter currents during the scanning interval and thereby eliminates the need for waveshaping circuits to control the base current of the switching transistor. Secondly, the positive feedback feature reduces the power requirement for the circuits which produce the base current and allows components of lower ratings to be used. Thirdly, the constant proportionality of base, collector, and emitter currents assists in the minimization of stored charge in the switching transistor.

BRIEF DESCRIPTION OF THE DRAWING

The above and other features and advantages of the present invention will become more apparent from the following description taken in conjunction with the accompanying drawing, in which.

DESCRIPTION OF PREFERRED EMBODIMENT

The improved deflection circuit of the present invention is particularly suited for use in applications where the resistance of the deflection coil is negligible as compared with its inductance. This situation occurs in the line scan deflection coil of a CRT which could be either the horizontal or vertical deflection coil dependent on the direction of line scan. However, by way of example and completeness of description, the deflection circuits will be described herein for the case of a horizontal deflection coil.

Figure 2:
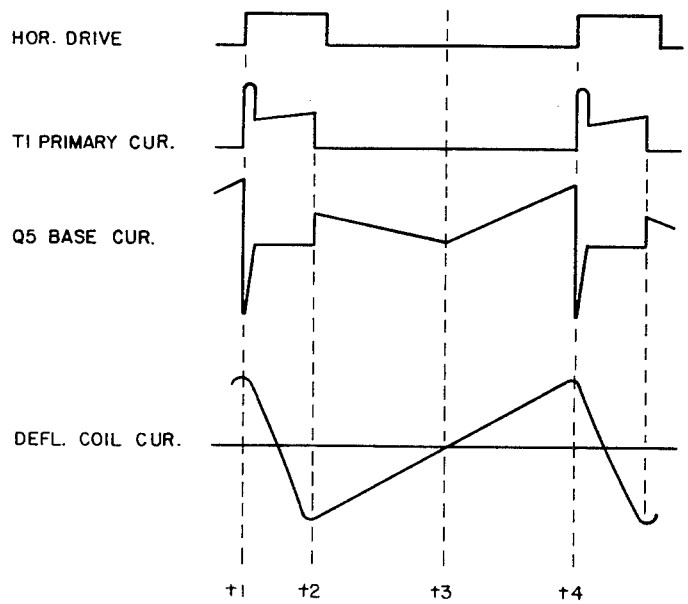

The deflection circuit is generally driven by a periodic horizontal drive signal which is illustrated in FIG. 2 as a pulse type signal. The deflection circuit responds to the horizontal drive signal to produce in the deflection coil a periodic sawtooth current, the waveform of which is also illustrated in FIG. 2. One period of the horizontal drive signal is defined for the illustrated example as commencing at time t1 and ending at time t4. The retrace interval is defined as occurring between times t1 and t2 and the scanning interval as occurring between times t2 and t4. During the scanning interval, the deflection coil current is substantially linear so as to produce a substantially horizontal scan at a substantially constant speed for distortion free picture formation. Since no picture formation takes place during the retrace interval, linearity is not required from time t1 to time t2.

Figure 1:
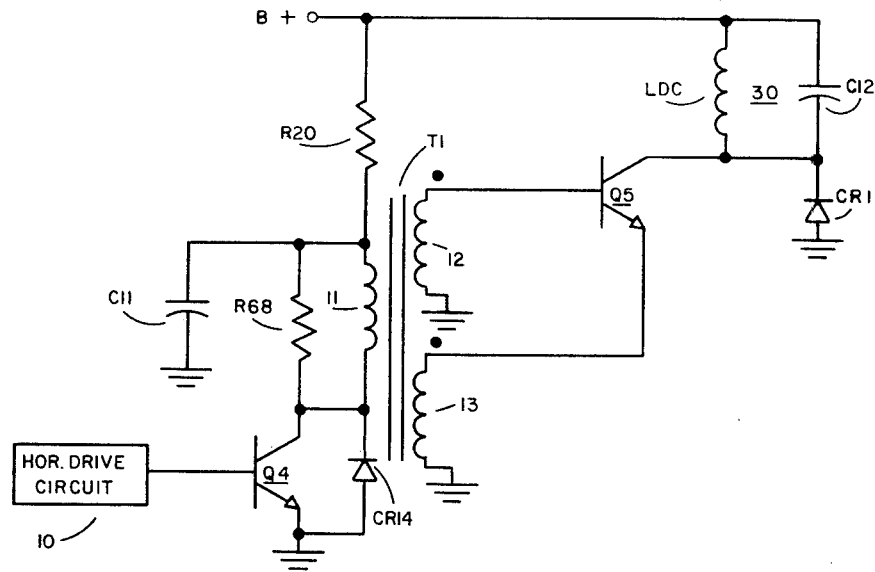
FIG. 1 is a circuit diagram of an electron beam deflection circuit embodying the present invention, and FIG. 2 consists of a number of waveforms which occur at various points in the deflection circuit of FIG. 1.

Turning now to the circuit diagram of FIG. 1, the deflection coil LDC is connected in a tank network 30. To this end, the deflection coil LDC is connected in series with a capacitor C15, a resistor R23 and a reference potential illustrated as circuit ground.

The tank network is connected in circuit with the collector and emitter leads of a switching transistor Q5. To this end, the collector lead is connected to the capacitor C12 and deflection coil LDC. The emitter lead is connected to circuit ground by way of a primary winding 13 of a transformer T1. A diode CR1 is connected between the tank network and ground.

A source of operating power B+ is arranged to supply operating energy to the tank network 30 and the transistor Q5. Thus, the deflection coil LDC is connected between the power source and the collector lead of transistor Q5. This portion of the circuit is conventional, and is simplified for the sake of clarity. Auxiliary components may be added for purposes other than deflection, such as extraction of high voltage, injection of centering currents, generation of non-linear waveforms, control of the scan width, and other purposes. Common to all of these variations, however, is the operation of transistor Q5, diode CR1, and transformer T1 as a bidirectional switching element, either grounded or floating.

The base lead of transistor Q5 is coupled to respond to the horizontal drive signal which is produced by a horizontal drive circuit 10. To this end, the output of horizontal drive circuit 10 is connected to the base lead of another transistor Q4. The emitter lead of transistor Q4 is connected to circuit ground. The collector lead is connected in series with the power source B+ by means of a resistor R20 and the primary winding 11 of transformer T1. Resistor R20 limits the collector current of transistor Q4 should the drive signal become other than optimal. A diode CR14 is connected between the collector and emitter leads of transistor Q4 with a polarity to protect the collector-base junction of transistor Q4 from transient negative going spikes which can couple back and influence the operation of the drive signal source. A resistor R68 is connected across the primary winding 11 and serves the purpose of damping transformer T1. A decoupling capacitor C11 is connected between the junction of resistor R20 and primary winding 11 and circuit ground. Capacitor C11 also provides a low impedance to enhance rapid switching of transistor Q5.

In operation, transistor Q4 responds to the horizontal drive pulse at time t1 to produce a negative voltage pulse in the primary winding 11, the resultant current waveform of which is illustrated in FIG. 2. This current pulse is characterized by a positive going spike at t1 which causes a negative going current spike in the secondary winding 12. This negative going current spike removes the stored charge in the switching transistor Q5, and drives the switching transistor Q5 into cutoff.

The tank network 30 is tuned so that energy stored in the deflection coil LDC during the previous scanning interval starts to ring or oscillate as transistor Q5 cuts off. Thus, at time t1 the deflection coil current declines sinusoidally from its positive peak value, crosses zero, and reaches its negative peak value at time t2. That is, the tank circuit is tuned so that the oscillatory half period is slightly less than the retrace interval. The voltage at the collector lead of transistor Q5 is 90 degrees out of phase with the deflection coil current. That is, this voltage begins to rise at time t1 and reaches a peak value at the time the deflection coil current crosses zero and then declines to cross zero as the deflection coil current reaches its negative peak value at time t2. As this voltage tends to go negative, diode CR1 becomes forward biased to clamp the collector lead of transistor Q5 one diode voltage drop away from circuit ground. The deflection coil current now flows through diode CR1. Since the voltage on the deflection coil LDC and capacitor C12 are fixed by diode CR1, the oscillation ceases, and the current in deflection coil LDC decays in a linear fashion. Diode CR1 remains in this forward biased condition until approximately the midpoint t3 of the next scanning interval. At time t3 the voltage at the collector lead of transistor Q5 becomes positive with respect to ground so as to remove the forward bias condition of diode CR1.

After time t2 the horizontal drive pulse terminates and causes transistor Q4 to cutoff. This in turn causes the current in transformer primary 11 to fall to zero. The energy stored in transformer T1 during the second half of the scan interval and the retrace interval now decays and results in a current flow in secondary winding 12. This decay is illustrated by the decline in base current from time t2 to time t3 in the waveform diagram of FIG. 2. The operating state of transistor Q5 at time t2 to t3 is unimportant as damping diode CR1 is forward biased and conducting the deflection coil current. However, what is important is that base current is being supplied at the time that the collector voltage rises at about time t3. Transistor Q5 quickly reaches a condition where its collector to emitter path becomes active to continue the charging of the deflection coil from time t3 to time t4. During this time, the transformer coupling between the emitter and base leads of transistor Q5 provides a positive feedback to enhance and sustain the base current and drive transistor Q5 further into conduction. This coupling also fixes the ratio of base, emitter, and collector currents. This minimizes the stored charge in transistor Q5.

In summary, the transformer coupled deflection circuit of this invention provides a number of benefits. First, base current is continuously supplied to the switching transistor throughout the entire scanning interval. This eliminates the need for waveshaping circuits which precisely control the base current waveshape and the on and off time of the switching transistor. Secondly, the positive feedback feature reduces the amount of power required by the various circuit components which are operative to produce the base current for transistor Q5. This allows the use of lower rated components for such items as the transistor Q4 and the various components included within the horizontal drive circuit 10. Thirdly, the circuit defines the base current directly in terms of the collector and emitter currents, rather than depending on voltage, time, and inductance relationships as conventional drive circuits do. This allows better control of charge storage in the switching device, resulting in faster switching times and lower stress on the switching device.

Although specific embodiments of the invention have been disclosed for illustrative purposes, it will be appreciated by those skilled in the art that many additions, modifications and substitutions are possible without departing from the scope and spirit of invention as defined in the accompanying claims.

What is claimed is:

1. In an electron beam deflection circuit which is coupled to a source of operating energy and which is responsive to a source of periodic drive signal to provide a periodic sawtooth current in a deflection coil, each period of the signal having a retrace interval and a scanning interval, the sawtooth current having a substantially linear ramp during the scanning intervals thereby storing energy in the deflection coil, the deflection circuit including a switching transistor having its base lead coupled to respond to the periodic drive signal and having its collector lead connected in circuit with a tank network, the tank network including the deflection coil and a damping diode; the circuit operation being such that during the retrace intervals the transistor is cut off and the damping diode becomes forward biased after the stored energy completes about one-half cycle of an oscillation in the tank network and continues to be forward biased to damp such oscillation and to complete a current path for the sawtooth current until approximately the midpoint of the ensuing scanning interval when the forward bias of the diode is removed and the collector to emitter path of the switching transistor thereafter completes the current path for the sawtooth current for the remainder of the scanning interval; the deflection circuit being further characterized by;

a transformer having a first primary winding coupled to receive the periodic drive signal, a second primary winding coupled to the emitter lead and a secondary winding coupled to the base lead of the switching transistor; the first primary winding conducting a current pulse during each retrace interval to cut off the switching transistor, the stored energy decaying and providing base current to the switching transistor during the first half of each scanning interval, the second primary winding providing base current during the second half of each scanning interval; and by the transformer coupling between the switching transistor base and emitter leads providing positive feedback so as to control the base current for the switching transistor throughout the time that the switching transistor is conducting.

2. The deflection circuit set forth in claim 1 being further characterized by another transistor which has its base lead coupled to respond to the source of periodic drive signal, and its collector and emitter leads connected in circuit with the primary winding of the transformer so as to provide a low impedance path during the retrace interval.

* * * * *